US009054500B2

(12) United States Patent
Chang-Chien et al.

(10) Patent No.: US 9,054,500 B2
(45) Date of Patent: Jun. 9, 2015

(54) INTEGRATED MICRO-PLASMA LIMITER

(71) Applicant: NORTHROP GRUMMAN SYSTEMS CORPORATION, Falls Church, VA (US)

(72) Inventors: Patty Chang-Chien, Redondo Beach, CA (US); Kelly Jill Hennig, Torrance, CA (US); Xianglin Zeng, Monterey Park, CA (US); Jeffrey M. Yang, Cerritos, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 230 days.

(21) Appl. No.: 13/865,921

(22) Filed: Apr. 18, 2013

(65) Prior Publication Data
US 2013/0321969 A1  Dec. 5, 2013

Related U.S. Application Data

(60) Provisional application No. 61/653,840, filed on May 31, 2012.

(51) Int. Cl.
*H01T 4/16* (2006.01)
*H03G 11/00* (2006.01)
*H01P 1/14* (2006.01)
*H01L 23/60* (2006.01)

(52) U.S. Cl.
CPC ... *H01T 4/16* (2013.01); *H01P 1/14* (2013.01); *H03G 11/002* (2013.01); *H03G 11/004* (2013.01); *H01L 23/60* (2013.01); *H01L 2924/0002* (2013.01)

(58) Field of Classification Search
USPC .............................. 361/56, 212, 220
See application file for complete search history.

(56) References Cited

U.S. PATENT DOCUMENTS

| 3,439,230 | A | * | 4/1969 | Lambert et al. | 361/531 |
| 3,754,811 | A | * | 8/1973 | Hoadley et al. | 359/454 |
| 3,775,642 | A | * | 11/1973 | Lange | 361/120 |
| 4,433,354 | A | * | 2/1984 | Lange et al. | 361/120 |
| 5,856,211 | A | * | 1/1999 | Tonazzi et al. | 438/69 |
| 5,900,062 | A | | 5/1999 | Loewenhardt | |
| 6,026,763 | A | * | 2/2000 | Kim et al. | 118/723 HC |
| 6,353,290 | B1 | | 3/2002 | Glenn | |
| 6,586,955 | B2 | | 7/2003 | Fjelstad | |
| 7,378,294 | B2 | | 5/2008 | Ding | |

(Continued)

OTHER PUBLICATIONS

Welch, Warren Neil, "Wafer Bonding: Overview of Science & Technology" NSF ERC for Wireless Integrated MicroSystems (WIMS) University of Michigan MNF pp. 1-69.

*Primary Examiner* — Thienvu Tran
*Assistant Examiner* — Angela Brooks
(74) *Attorney, Agent, or Firm* — John A. Miller; Miller IP Group, PLC

(57) ABSTRACT

A plasma power limiter fabricated using wafer-level fabrication techniques with other circuit elements. The plasma limiter includes a signal substrate and a trigger substrate defining a hermetically sealed cavity therebetween in which is encapsulated an ionizable gas. The signal substrate includes a signal line within the cavity and the trigger substrate includes at least one trigger probe extending from the trigger substrate towards the transmission line. If a signal propagating on the transmission line exceeds a power threshold, the gas within the cavity is ionized creating a conduction path between the transmission line and the trigger probe that draws off the high power current.

20 Claims, 2 Drawing Sheets

(56) References Cited

U.S. PATENT DOCUMENTS

| | | |
|---|---|---|
| 7,381,943 B2 | 6/2008 | Lee |
| 7,637,149 B2 | 12/2009 | Degertekin |
| 8,169,145 B2 * | 5/2012 | Boy et al. ............... 313/631 |
| 2002/0116818 A1 * | 8/2002 | Bailey ................. 29/890.08 |
| 2004/0164946 A1 * | 8/2004 | Cavanaugh et al. ......... 345/101 |
| 2004/0252438 A1 | 12/2004 | Mankowsk |
| 2006/0209485 A1 * | 9/2006 | Imai et al. ................ 361/120 |
| 2007/0014069 A1 | 1/2007 | Krueger |
| 2008/0165466 A1 | 7/2008 | Gritter |
| 2009/0026598 A1 * | 1/2009 | Tornquist Hennig et al. 257/682 |
| 2009/0026627 A1 * | 1/2009 | Chang-Chien et al. ....... 257/774 |
| 2009/0029554 A1 * | 1/2009 | Chang-Chien et al. ....... 438/703 |
| 2010/0296978 A1 | 11/2010 | Park |
| 2011/0043742 A1 * | 2/2011 | Cavanaugh ................ 349/153 |
| 2011/0170108 A1 | 7/2011 | Degertekin |
| 2012/0142144 A1 | 6/2012 | Taheri |
| 2012/0256233 A1 * | 10/2012 | Cui et al. ................. 257/195 |

\* cited by examiner

US 9,054,500 B2

INTEGRATED MICRO-PLASMA LIMITER

CROSS-REFERENCE TO RELATED APPLICATIONS

This application claims the benefit of the filing date of provisional application Ser. No. 61/653,840 titled, Integrated Micro-Plasma Limiter, filed May 31, 2012.

BACKGROUND

1. Field

This invention relates generally to a plasma power limiter and, more particularly, to a plasma power limiter that is monolithically fabricated using wafer-level processing so as to be integrated on the same wafer as other circuits.

2. Discussion of the Art

It is known in the art to provide wafer-level packaging for integrated circuits, such as monolithic millimeter-wave integrated circuits (MMIC), formed on substrate wafers. In one wafer-level packaging design, a cover wafer is mounted to the substrate wafer using a bonding ring so as to provide a hermetically sealed cavity in which the integrated circuit is provided. Typically, many integrated circuits are formed on the substrate wafer and covered by a single cover wafer, where each integrated circuit is surrounded by a separate bonding ring. The cover wafer and the substrate are then diced between the bonding rings to separate the packages for each separate integrated circuit. The dicing process typically requires the use of a saw that cuts the cover wafer between the packages, where a portion of the cover wafer is removed. The substrate wafer is then cut between the packages.

Integrated circuits can be susceptible to high intensity or high power signals, such as electromagnetic pulses (EMP), whether they be unintended random signals or intentional hostile signals. For example, high performance electronic circuits used in many receivers may be sensitive to high power input signals. Particularly, low noise amplifiers (LNA) provided immediately behind the antenna at the front end of a receiver can be destroyed if the antenna receives a high intensity power signal, where the power susceptibility of the LNA becomes more sensitive to incoming power as the frequency and noise performance of the receiver increases.

In order to address this concern related to the damaging effects of high power signals, plasma power limiters have been developed in the art that are provided at the front end of these types of circuits. A typical plasma power limiter will include a sealed cavity in which is encapsulated a suitable ionizable gas, such as argon, that when ionized becomes a plasma and allows electrical current to propagate therethrough. If the incoming signal is of a high enough intensity where the gas is ionized, current generated by the signal can be directed through the plasma to a sinking electrode, where it can harmlessly be sent to a ground potential.

Known plasma power limiters are typically separate bulky devices provided at the front end of the receiver or other circuit that cause significant signal loss before the signal can be amplified for further processing. Therefore, for some applications the design of the specific circuit would not allow for such a power limiter to be incorporated.

DETAILED DESCRIPTION OF THE EMBODIMENTS

The following discussion of the embodiments of the invention directed to an integrated wafer-level plasma power limiter is merely exemplary in nature, and is in no way intended to limit the invention or its applications or uses. For example, the discussion herein is directed to the plasma limiter being employed in the front end of a receiver. However, as will be appreciated by those skilled in the art, the plasma power limiter discussed herein can be used in any suitable circuit that includes electronics that could be damaged by high intensity signals.

Figure 1:
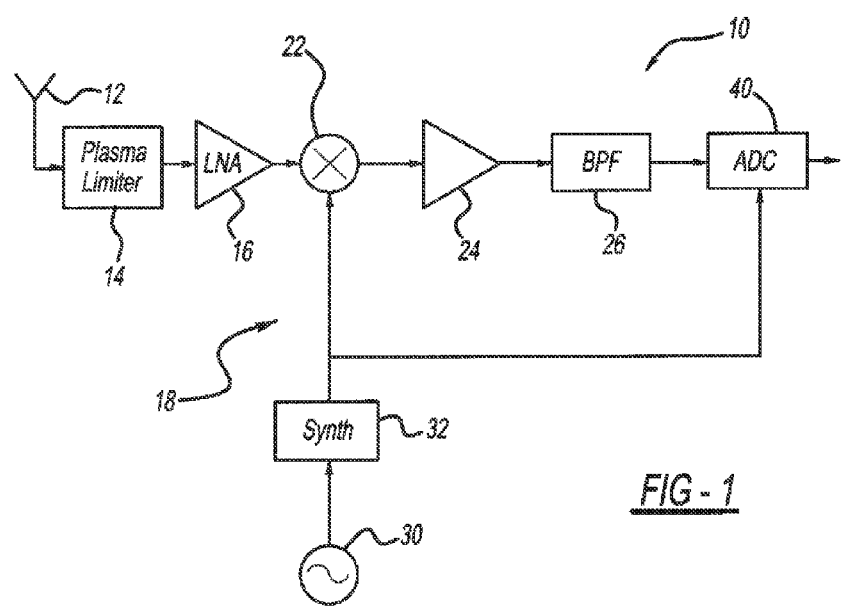
FIG. 1 is a schematic diagram of a front end of a receiver.

FIG. 1 is a simple schematic block diagram of a front end of a receiver 10 that could have many applications, such as wireless communication applications. The receiver 10 is intended to represent any receiver operated at any desirable frequency and being responsive to signals from any suitable source. The receiver 10 includes an antenna 12 that receives the signals to be processed by the receiver 10. The antenna 12 can be any antenna suitable for the purposes discussed herein and can have different configurations for the particular frequency band of interest, as would be well understood by those skilled in the art. Signals received by the antenna 12 are first sent to a plasma power limiter 14 that protects sensitive electronics in the receiver circuit 10, as will be discussed in detail below. The plasma limiter 14 is a monolithic integrated circuit formed on the same wafer as other electrical circuits in the receiver 10 using wafer-level packaging so that the plasma limiter 14 is fabricated during and using the same fabrication steps that fabricate those circuits on the wafer.

Signals that are below a threshold power intensity are passed directly through the plasma limiter 14 and received by an LNA 16 that amplifies the signals from the antenna 12 to a desired signal level for subsequent processing. The amplified signal is then sent to a frequency down-converter 18 that converts the high frequency received signal to an intermediate frequency (IF) signal suitable to be effectively converted to a digital signal. The frequency down-converter 18 includes a local oscillator (LO) 30, a mixer 22, an amplifier 24, a band-pass filter (BPF) 26 and a synthesizer 32. The amplified signal from the LNA 16 is sent to the mixer 22 along with a tuned LO signal provided by the LO 30 and tuned to the desired frequency by the synthesizer 32 to down-convert the higher frequency received signal to the IF frequency. The IF signal is band-pass limited by the BPF 26 to a particular frequency band, where the combination of the mixer 22 and the BPF 26 provide the desired frequency control of the IF signal during the down-conversion process. The band-pass filtered IF signal from the BPF 26 is sent to an analog-to-digital converter (ADC) 40 that converts the analog signal to a digital signal for subsequent processing at the back-end of the receiver circuit 10, where the ADC 40 receives the tuned LO signal from the synthesizer 32 as a timing signal.

Figure 2:
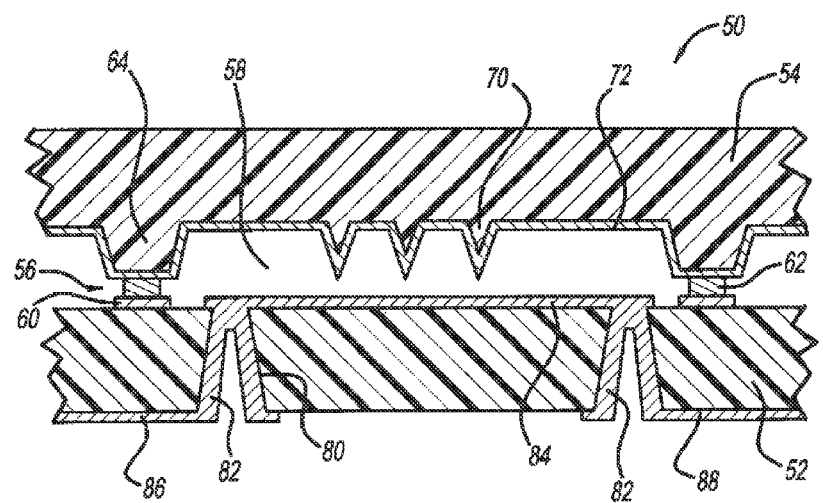
FIG. 2 is a cross-sectional view of a wafer-level integrated plasma limiter including vertical probe tips that can be used in the circuit shown in FIG. 1.

FIG. 2 is a cross-sectional view of a plasma power limiter 50 that can be used as the plasma limiter 14 in the receiver 10. Although the power limiter 50 has particular application for the receiver 10, this is by way of a non-limiting example in that the power limiter 50 can be used in any circuit where high intensity or high power signals may damage other circuits, including transmitter circuits. The plasma limiter 50 includes a substrate wafer 52 and a cover wafer 54 that are sealed by a bonding layer 56 to define a hermetically sealed cavity 58 between the wafers 52 and 54 in a manner that is well understood by those skilled in the art. The wafers 52 and 54 can be any suitable semiconductor wafer, such as group III-V semiconductors, silicon, etc. For example, the cover wafer 54 can be silicon and the substrate wafer 52 can be InP, SiC or GaAs. The bonding layer 56 can be any suitable combination of layers and materials to provide the hermetically sealed cavity 58, such as a gold layer 60 provided on the substrate wafer 52 and a gold layer 62 provided on the cover wafer 54, where a low temperature bonding process is employed to bond the layers 60 and 62 to form the bonding layer 56 in a process well understood by those skilled in the art. A perimeter section 64 of the cover wafer 54 provides the dimension to define the size of the cavity 58 in a manner also well understood by those skilled in the art.

During the sealing process to provide the cavity 58, the wafers 52 and 54 are placed in a chamber, and a suitable ionizable gas, such as an inert gas, for example, argon, is provided in the chamber so that it is sealed within the cavity 58. Further, prior to the cover wafer 54 being sealed to the substrate wafer 52, the cover wafer 54 is micro-machined to form a series of vertical probe tips 70, also referred to herein as plasma triggers. The probe tips 70 are formed so that when the wafers 52 and 54 are bonded together, the probe tips 70 extend towards the substrate wafer 52 a controlled distance for reasons that will become apparent from the discussion below. Further, prior to the wafers 52 and 54 being bonded together, a metallic coating or layer 72 is deposited on the cover wafer 54 to provide an electrically conductive path for sinking the high powered signals, and to prolong the life of the probe tips 70 that receive the concentrated electrical signal when the plasma is generated by ionization of the gas in the sealed cavity 58. The metallic layer 72 can be any suitable conductive material, such as aluminum, copper, tungsten, nickel, refractory metals, etc.

Prior to the wafers 52 and 54 being sealed together, the substrate wafer 52 is fabricated to form vias 80 through the wafer 52, which are then metalized by a suitable via metal 82, such as copper. One or more microstrip lines 84 are deposited on a surface of the substrate 52 that will face the cavity 58, where the microstrip lines 84 are electrically coupled to the via metals 82. The microstrip line 84 is sized and dimensioned for the particular frequency of the receiver 10 or other architecture in which the limiter 50 will be employed so that the microstrip line 84 has low impedance for the signal propagating along the line 84. An input signal line 86 is deposited on a bottom surface of the substrate wafer 52 opposite to the cavity 58 and is directly coupled to the antenna 12. An output signal line 88 also deposited on the bottom surface of the substrate wafer 52 opposite to the cavity 58 is electrically coupled to the output via metal 82 on the side of the wafer 52 opposite to the cavity 58 so that it receives the signal propagating through a microstrip line 84.

During operation of the limiter 50, those signals received by the antenna 12 that are at a low enough intensity so as to not ionize the gas within the cavity 58 propagate directly through the limiter 50 along the microstrip line 84 as described with little or no loss. If the intensity or power of the received signal is high enough to ionize the gas within the cavity 58, which is designed to be at a lower potential than could damage the front-end components in the receiver 10, propagation of the high intensity signal along the microstrip line 84 will ionize the gas within the cavity 58, which generates a plasma that is conductive and allows current flow from the line 84 to the probe tips 70. Once the gas in the cavity 58 is ionized to generate a conductive path across the cavity 58, the power of the signal still needs to be above some threshold, which is related to how much of the gas is ionized, to provide the current flow through the gas, which is based on various factors discussed in more detail below. The metallic layer 72 is electrically coupled to a ground or reference potential so that current received by the probe tips 70 can flow to that potential.

The probe tips 70 provide a control architecture for determining the amount of power that the plasma limiter 50 will allow to propagate therethrough. Without the probe tips 70, the microstrip line 84 and the metallic coating 72 would operate as parallel plates and the distance between those plates would determine whether current would conduct across the cavity 58 if the gas were ionized. By providing the probe tips 70 that extend into the cavity 58, the probe tips 70 act as an electromagnetic field concentrator and the distance between the probe tips 70 and the microstrip line 84 determines how easily current will flow from the microstrip line 84 to the metallic coating 72 when the gas is ionized. The distance between the probe tips 70 and the microstrip line 84 and the gas used are thus designed to set what power level the plasma limiter 50 is to be activated. Further, other criteria go into the design of when the plasma limiter 50 is activated, including the number of probe tips 70, the material of the metallic layer 72, the space between probe tips 70, etc. The metallic layer 72 is selected not only for its current carrying properties, but also for its ability to withstand the arcing environment generated by the plasma for longevity purposes.

The plasma limiter 50 offers one design that is applicable to sink current using an ionizable gas in a wafer-level processing configuration. The location, orientation, size, etc. of the plasma triggers can be changed for different fabrication techniques within the scope of the present invention.

Figure 3:
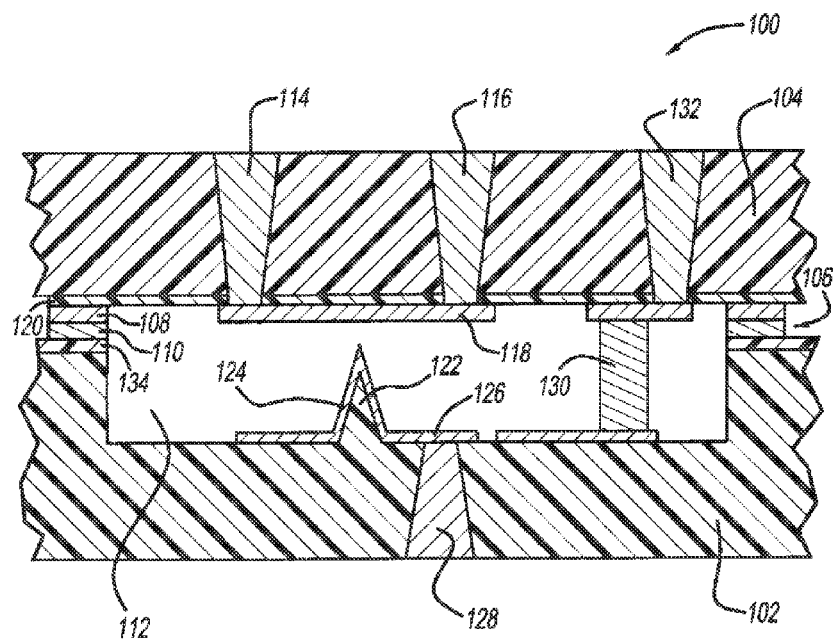
FIG. 3 is a cross-sectional view of a wafer-level integrated plasma limiter including a vertical probe tip.

FIG. 3 is a cross-sectional view of a plasma power limiter 100 having a different design than the plasma limiter 50, but which operates under the same principle. The plasma limiter 100 is shown prior to being "flipped" for mounting purposes, where the wafer that includes the plasma trigger is at the bottom and is referred to as a trigger substrate 102 and the wafer that includes the signal line is at the top and is referred to as a signal substrate 104. The substrates 102 and 104 are sealed by a bonding layer 106 that includes gold layers 108 and 110 in the same manner as discussed above to define a hermetically sealed cavity 112 including the ionizable gas. The signal received by the antenna 12 is sent to an input via 114 extending through the substrate 104 and exits the cavity 112 through an output via 116 extending through the substrate 104, where the vias 114 and 116 are electrically coupled by a microstrip line 118 in the cavity 112. The microstrip line 118 can be any suitable metal for the purposes described herein. An insulating layer 120, such as silicon nitride, is deposited on the surface of the signal substrate 104 facing the cavity 112 and provides electrical isolation for the microstrip line 118, and an insulating layer 134, such as silicon nitride, is deposited on the surface of the trigger substrate 102 facing the cavity 112.

The trigger substrate 102 includes a plasma trigger 122 having a metalized coating 124 that is electrically coupled to an electrode 126. When the gas in the cavity 112 is ionized and generates a plasma as a result of a high power signal propagating on the mircrostrip line 118, current flow across the cavity 112 is received by the plasma trigger 122 consistent with the discussion herein. The limiter 100 can sink that current flow in any suitable manner for the particular device. For example, the electrode 126 can be electrically coupled to a metal via 128 extending through the trigger substrate 102 that would be electrically coupled to a ground potential. Alternately, the electrode 126 can be electrically coupled to an intra-cavity interconnect (ICIC) 130 crossing the cavity 112 and being electrically coupled to a metal output via 132 extending through the substrate 104.

Although not specifically shown, it is also possible to provide electrodes or other top metals on the insulating layer 120 electrically isolated from the microstrip line 18 that can receive the current generated by the ionization of the gas, where that current flow could be directed to the via 132 or through the ICIC 130 and the via 128. In yet another embodiment, the electrode 126 can be spaced a distance from a ring surrounding the plasma trigger 122 where ionization of the gas allows the current to travel across the gap between the electrode 126 and the ring, and be removed from the plasma limiter 100.

A plurality of the plasma power limiters can be cascaded in series where each plasma limiter may or may not be designed for a different power level to provide further protection for the circuitry behind the plasma limiters. For example, if a high intensity signal is received by the plasma limiter, where the gas is ionized and current is sinked to ground, some of the current still may flow out of the plasma limiter on the output signal line and still be at high power. Another plasma limiter that receives that signal could provide further protection. Additionally, the cascaded plasma limiters could be designed to be activated at different voltage thresholds so that the monolithically integrated circuit that included the plasma limiters could be provided for a variety of different applications.

Figure 4:
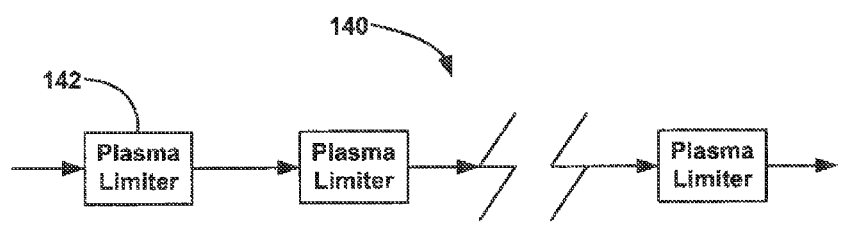
FIG. 4 is a block diagram of a plasma power limiter circuit including a plurality of cascaded plasma limiters.

FIG. 4 is provided to illustrate cascaded plasma power limiters, as discussed. FIG. 4 is a block diagram of a plasma power limiter circuit 140 including a plurality of series connected plasma power limiters 142. The plasma limiters 142 can be any plasma power limiter consistent with the discussion herein, such as the plasma power limiters 50 and 100. The plasma limiters 142 can be the same design or different designs and can have the same or different activation thresholds, where the plasma triggers could be spaced at different distances from the signal line in each of the plasma limiters 142. Further the number and type of plasma triggers in each of the plasma limiters 142 could be the same or different to provide the same or different activation thresholds.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A plasma power limiter comprising:
a signal substrate having a first side and a second side, said signal substrate including a signal-in line formed on the first side of the signal substrate, a signal-in via extending through the signal substrate and being electrically coupled to the signal-in line, a signal transmission line formed on the second side of the signal substrate and being electrically coupled to the signal-in via, a signal-out via extending through the signal substrate and being electrically coupled to the signal transmission line and a signal-out line formed on the first surface of the signal substrate and being electrically coupled to the signal-out via; and
a trigger substrate having a first side and a second side, said trigger substrate being bonded to the signal substrate so as to form a hermetically sealed cavity where the second side of the signal substrate faces the second side of the trigger substrate within the cavity, said trigger substrate including at least one trigger probe extending from the second side of the trigger substrate into the cavity towards the signal line, said cavity being filled with an ionizable gas, said at least one trigger probe being covered by a trigger metal, wherein a signal propagating from the signal-in line to the signal-out line through the signal line having a power level greater than a threshold power level will ionize the gas within the cavity and create a short circuit between the signal transmission line and the trigger probe.

2. The plasma limiter according to claim 1 wherein the at least one trigger probe is a plurality of spaced apart trigger probes extending from the second surface of the trigger substrate all being covered by the trigger metal.

3. The plasma limiter according to claim 1 wherein the trigger substrate is silicon and the signal substrate is selected from the group consisting of InP, SiC and GaAs.

4. The plasma limiter according to claim 1 wherein the trigger substrate includes a trigger probe via extending through the trigger substrate and being electrically coupled to the trigger metal, said trigger via being responsive to current flow from the trigger metal that flows across the ionization gas to be sent to a ground potential.

5. The plasma limiter according to claim 1 further comprising an intra-cavity interconnect electrically coupled to the trigger metal and a trigger via extending through the signal substrate and being electrically coupled to the intra-cavity interconnect.

6. The plasma limiter according to claim 1 wherein the plasma limiter is fabricated using wafer-level fabrication techniques where the plasma limiter is formed at the same time as other circuit elements.

7. The plasma limiter according to claim 6 wherein the plasma limiter is part of a receiver front end between an antenna and a low noise amplifier.

8. The plasma limiter according to claim 1 wherein the plasma limiter is one of a plurality of plasma power limiters electrically coupled in series.

9. The plasma limiter according to claim 8 wherein the plurality of plasma limiters have different activation thresholds.

10. A plasma power limiter comprising:
a signal substrate having a first side and a second side, said signal substrate including a signal-in line formed on the first side of the signal substrate, a signal-in via extending through the signal substrate and being electrically coupled to the signal-in line, a signal transmission line formed on the second side of the signal substrate and being electrically coupled to the signal-in via, a signal-out via extending through the signal substrate and being electrically coupled to the signal transmission line and a signal-out line formed on the first surface of the signal substrate and being electrically coupled to the signal-out via; and
a trigger substrate having a first side and a second side, said trigger substrate being bonded to the signal substrate so as to form a hermetically sealed cavity where the second side of the signal substrate faces the second side of the trigger substrate within the cavity, said trigger substrate including a plurality of spaced apart trigger probes extending from the second surface of the trigger substrate into the cavity towards the signal line, said cavity being filled with an ionizable gas, said plurality of spaced apart trigger probes being covered by a trigger metal, wherein a signal propagating from the signal-in line to the signal-out line through the signal line having a power level greater than a threshold power level will ionize the gas within the cavity and create a short circuit between the signal transmission line and the trigger probes, and wherein the plasma limiter is fabricated using wafer-level fabrication techniques where the plasma limiter is formed at the same time as other circuit elements.

11. The plasma limiter according to claim 10 wherein the trigger substrate is silicon and the signal substrate is selected from the group consisting of InP, SiC and GaAs.

12. The plasma limiter according to claim 10 wherein the plasma limiter is part of a receiver front end between an antenna and a low noise amplifier.

13. The plasma limiter according to claim 10 wherein the plasma limiter is one of a plurality of plasma power limiters electrically coupled in series.

14. The plasma limiter according to claim 13 wherein the plurality of plasma limiters have different activation thresholds.

15. A plasma power limiter comprising:
a signal substrate having a first side and a second side, said signal substrate including a signal-in line formed on the first side of the signal substrate, a signal-in via extending through the signal substrate and being electrically coupled to the signal-in line, a signal transmission line formed on the second side of the signal substrate and being electrically coupled to the signal-in via, a signal-out via extending through the signal substrate and being electrically coupled to the signal transmission line and a signal-out line formed on the first surface of the signal substrate and being electrically coupled to the signal-out via; and
a trigger substrate having a first side and a second side, said trigger substrate being bonded to the signal substrate so as to form a hermetically sealed cavity where the second side of the signal substrate faces the second side of the trigger substrate within the cavity, said trigger substrate including at least one trigger probe extending from the second side of the trigger substrate into the cavity towards the signal line, said cavity being filled with an ionizable gas, said at least one trigger probe being covered by a trigger metal, said trigger substrate including a trigger probe via extending through the trigger substrate and being electrically coupled to the trigger metal, said trigger via being responsive to current flow from the trigger metal that flows across the ionization gas to be sent to a ground potential, wherein a signal propagating from the signal-in line to the signal-out line through the signal line having a power level greater than a threshold power level will ionize the gas within the cavity and create a short circuit between the signal transmission line and the trigger probe, and wherein the plasma limiter is fabricated using wafer-level fabrication techniques where the plasma limiter is formed at the same time as other circuit elements.

16. The plasma limiter according to claim 15 further comprising an intra-cavity interconnect electrically coupled to the trigger metal and a trigger via extending through the signal substrate and being electrically coupled to the intra-cavity interconnect.

17. The plasma limiter according to claim 15 wherein the plasma limiter is part of a receiver front end between an antenna and a low noise amplifier.

18. The plasma limiter according to claim 15 wherein the plasma limiter is one of a plurality of plasma power limiters electrically coupled in series.

19. The plasma limiter according to claim 18 wherein the plurality of plasma limiters have different activation thresholds.

20. The plasma limiter according to claim 15 wherein the trigger substrate is silicon and the signal substrate is selected from the group consisting of InP, SiC and GaAs.

* * * * *